United States Patent
Brown et al.

(10) Patent No.: US 10,418,473 B1
(45) Date of Patent: Sep. 17, 2019

(54) MONOLITHIC INTEGRATION OF GROUP III NITRIDE EPITAXIAL LAYERS

(71) Applicant: HRL LABORATORIES LLC, Malibu, CA (US)

(72) Inventors: David F. Brown, Woodland Hills, CA (US); Keisuke Shinohara, Thousand Oaks, CA (US); Miroslav Micovic, Thousand Oaks, CA (US); Andrea Corrion, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/891,336

(22) Filed: Feb. 7, 2018

Related U.S. Application Data

(62) Division of application No. 15/148,991, filed on May 6, 2016, now Pat. No. 9,954,090, which is a division of application No. 14/312,518, filed on Jun. 23, 2014, now Pat. No. 9,378,949, which is a division of application No. 13/897,038, filed on May 17, 2013, now Pat. No. 8,796,736, which is a division of application No. 13/105,706, filed on May 11, 2011, now Pat. No. 8,470,652.

(51) Int. Cl.
| | |
|---|---|
| H01L 29/66 | (2006.01) |
| H01L 29/778 | (2006.01) |
| H01L 21/265 | (2006.01) |
| H01L 21/8252 | (2006.01) |
| H01L 27/095 | (2006.01) |
| H01L 29/205 | (2006.01) |
| H01L 29/20 | (2006.01) |

(52) U.S. Cl.
CPC .... *H01L 29/7784* (2013.01); *H01L 21/26546* (2013.01); *H01L 21/8252* (2013.01); *H01L 27/095* (2013.01); *H01L 29/2003* (2013.01); *H01L 29/205* (2013.01); *H01L 29/66462* (2013.01)

(58) Field of Classification Search
CPC .................................................. H01L 21/02458
USPC ....................................................... 438/172
See application file for complete search history.

(56) References Cited

U.S. PATENT DOCUMENTS

| | | | |
|---|---|---|---|
| 4,774,205 A | 9/1988 | Choi et al. |
| 4,791,072 A | 12/1988 | Kiehl |
| 4,847,665 A | 7/1989 | Mand |
| 4,940,672 A | 7/1990 | Zavracky et al. |
| 5,021,361 A | 6/1991 | Kinoshita et al. |
| 5,041,393 A | 8/1991 | Ahrens et al. |
| 5,051,372 A | 9/1991 | Sasaki |
| 5,075,239 A | 12/1991 | Tegude |

(Continued)

OTHER PUBLICATIONS

Dasguta, S. "Ultralow non-alloyed Ohmic contact resistance to self-aligned N-polar GaN high electron mobility transistors by In(Ga)N regrowth" Appl. Phys. Lett. 96, Apr. 7, 2010 pp. 143504-1 through 143504-3.*

(Continued)

*Primary Examiner* — Grant S Withers
(74) *Attorney, Agent, or Firm* — Ladas & Parry

(57) ABSTRACT

A monolithically integrated device includes a substrate, a first set of Group III nitride epitaxial layers grown for a first HFET on a first region of the substrate, and a second set of Group III nitride epitaxial layers for a second HFET grown on a second region of the substrate.

9 Claims, 8 Drawing Sheets

(56) References Cited

U.S. PATENT DOCUMENTS

| | | | |
|---|---|---|---|
| 5,399,896 | A | 3/1995 | Oku |
| 5,405,797 | A | 4/1995 | Brugger |
| 5,432,123 | A | 7/1995 | Dentai et al. |
| 5,567,961 | A | 10/1996 | Usagawa et al. |
| 5,885,847 | A | 3/1999 | Yoon et al. |
| 6,265,727 | B1 | 7/2001 | Kozodoy et al. |
| 6,465,289 | B1 | 10/2002 | Streit et al. |
| 6,503,768 | B2 | 1/2003 | Cho et al. |
| 6,574,259 | B1 | 6/2003 | Fish et al. |
| 6,767,835 | B1 | 7/2004 | Nariman et al. |
| 7,112,860 | B2 | 9/2006 | Saxler |
| 7,449,728 | B2 | 11/2008 | Wohlmuth |
| 7,662,682 | B2 | 2/2010 | Saxler et al. |
| 7,875,910 | B2 | 1/2011 | Sheppard et al. |
| 7,989,277 | B1 | 8/2011 | Luh et al. |
| 8,368,119 | B1 | 2/2013 | Luh et al. |
| 8,470,652 | B1 | 6/2013 | Brown et al. |
| 9,954,090 | B1 | 4/2018 | Brown et al. |
| 2002/0167023 | A1 | 11/2002 | Chavarkar et al. |
| 2002/0177261 | A1 | 11/2002 | Song |
| 2003/0141518 | A1 | 7/2003 | Yokogawa et al. |
| 2004/0238842 | A1 | 12/2004 | Micovic et al. |
| 2005/0263789 | A1 | 12/2005 | Hwang |
| 2006/0049427 | A1 | 3/2006 | Takahashi |
| 2006/0208279 | A1 | 9/2006 | Robinson et al. |
| 2006/0278891 | A1 | 12/2006 | Saxler et al. |
| 2006/0289901 | A1 | 12/2006 | Sheppard et al. |
| 2007/0018210 | A1 | 1/2007 | Sheppard |
| 2007/0138565 | A1 | 6/2007 | Datta et al. |
| 2008/0023726 | A1 | 1/2008 | Adesida et al. |
| 2008/0169474 | A1 | 7/2008 | Sheppard |
| 2010/0032717 | A1 | 2/2010 | Palacios et al. |
| 2010/0052013 | A1 | 3/2010 | Yoshinaga et al. |
| 2011/0076811 | A1 | 3/2011 | Miyakoshi |
| 2011/0140176 | A1 | 6/2011 | Briere |
| 2011/0147762 | A1 | 6/2011 | Sheppard |
| 2011/0316049 | A1 | 12/2011 | Sugimoto et al. |
| 2012/0126288 | A1 | 5/2012 | Bito |
| 2012/0132960 | A1 | 5/2012 | Urteaga |
| 2012/0187412 | A1 | 7/2012 | D'Evelyn et al. |
| 2013/0270572 | A1 | 10/2013 | Brown et al. |

OTHER PUBLICATIONS

Singisetti, U. "InGaAs channel MOSFET with self-aligned source/drain MBE regrowth technology" Phys. Stat. Soli. Jun. 8, 2009 pp. 1394-1398.*

Rajan, S. "N-polar GaN/AlGaN/GaN high electron mobility transistors" Jour. of App. Phys. 102 Aug. 17, 2007 pp. 044501-1 through 044501-5.*

MacDonald, S. "Plasma-Developable Photoresist Systems Based on Chemical Amplification" Chem. Mater. 3, May 1991 pp. 435-442 (Year: 1991).*

Cai, Y. "Control of Threshold Voltage of AlGaN/GaN HEMTs by Fluoride-Based Plasma Treatment: From Depletion Mode to Enhancement Mode" IEEE Transactions on Electron Devices vol. 53, No. 9 Sep. 2006 (Year: 2006).*

Bar-Chaim et al., "Monolithic optoelectronic integration of a GaAlAs laser, a field-effect transistor, and a photodiode", Appl. Phys. Lett., vol. 44, pp. 941-943, (1984).

Brown, "Monolithic Integration of Enhancement- and Depletion-Mode AlN/GaN/AlGaN DHFETs by Selective MBE Regrowth" IEEE Transactions on Electron Devices, vol. 58, No. 4 first published Feb. 7, 2011.

Cai et al., "High-performance enhancement-mode AlGaN/GaN HEMTs using fluoride-based plasma treatment," IEEE Electron Device Lett., vol. 26, No. 7, pp. 435-437, 2005.

Cai et al., "Monolithic integration of enhancement- and depletion-mode AlGaN/GaN HEMTs for GaN digital integrated circuits," in IEDM Tech. Dig., Dec. 2005, pp. 771-774.

Chu et al., "V-gate GaN HEMTs with engineered buffer for normally off operation," IEEE Electron Device Letters, vol. 29, No. 11, pp. 1184-1186, Nov. 2008.

Corrion et al., "Enhancement-mode AlN/GaN/AlGaN DHFET with 700 mS/mm $g_m$ and 112 GHz $f_T$," Accepted by IEEE Electron Device Lett, Oct. 2010.

Egawa et al., "Monolithic Integration of AlGaAs/GaAs MQW Laser Diode and GaAs MESFET Grown on Si Using Selective Regrowth," IEEE Photonics Technology Letters, vol. 4, No. 6, pp. 612-614, Jun. 1992.

Higashiwaki et al., "Enhancement-mode AlN/GaN HFETs using Cat-CVD SiN," IEEE Trans. Electron Devices, vol. 54, No. 6, pp. 1566-1570, Jun. 2007.

Lin et al., "Monolithic Integration of E/D-mode pHEMT and InGaP HBT Technology on 150-mm GaAs wafers", CS Mantech Conference, Austin TX, May 14-17, 2007.

Micovic et al., "GaN double heterojunction field effect transistor for microwave and millimeterwave power applications," in IEDM Tech. Dig., 2004, pp. 807-810.

Micovic et al., "GaN enhancement/depletion-mode FET logic for mixed signal applications," Electronics Letters, vol. 41, No. 19, pp. 348-350, Sep. 2005.

Micovic et al., "GaN HFET for W-band Power Applications" IEEE (2009).

Micovic et al., "W-band GaN MMIC with 842 mW Output Power at 88 GHz," presented at the International Microwave Symposium, Anaheim, CA, May 23-28, 2010.

Palacios et al., "High-performance E-mode AlGaN/GaN HEMTs," IEEE Electron Device Lett., vol. 27, No. 6, pp. 428-430, Jun. 2006.

Pei et al., "Recessed Slant Gate AlGaN/GaN High Electron Mobility Transistors with 20.9 W/mm at 10 GHz," Jpn. J. Appl. Phys, vol. 46, No. 45, pp. L1087, Nov. 2007.

Ren, "State-of-the-Art Program on Compound Semiconductors 45 (SOTAPOCS 45)—and- Wide Bandgap Semiconductor Materials and Devices 7" ECS Transactions vol. 3 No. 5 Copyright 2006 pp. 164.

Streit et al., "Monolithic HEMT-HBT Integration by Selective MBE," IEEE Trans. Electron Devices, vol. 42, No. 4, pp. 618-623, Apr. 1995.

Wang et al., "Planar Integration of E/D-mode AlGaN/GaN HEMTs Using Fluoride-Based Plasma Treatment", IEEE Electron Device Letters, vol. 27, No. 8, Aug. 2006.

Wu et al., "30 W/mm GaN HEMTs by field plate optimization," IEEE Electron Device Lett., vol. 25, No. 3, pp. 117-119, Mar. 2004.

From U.S. Appl. No. 13/105,706 (now U.S. Pat. No. 8,470,652), Restriction Requirement dated Dec. 5, 2012.

From U.S. Appl. No. 13/105,706 (now U.S. Pat. No. 8,470,652), Notice of Allowance dated Feb. 19, 2013.

From U.S. Appl. No. 13/897,038 (now U.S. Pat. No. 8,796,736), Restriction Requirement dated Nov. 5, 2013.

From U.S. Appl. No. 13/897,038 (now U.S. Pat. No. 8,796,736), Non-Final Office Action dated Dec. 4, 2013.

From U.S. Appl. No. 13/897,038 (now U.S. Pat. No. 8,796,736), Notice of Allowance dated Mar. 24, 2014.

From U.S. Appl. No. 14/312,518 (now U.S. Pat. No. 9,378,949), Ex Parte Quayle dated Dec. 21, 2015.

From U.S. Appl. No. 14/312,518 (now U.S. Pat. No. 9,378,949), Final Rejection dated Sep. 1, 2015.

From U.S. Appl. No. 14/312,518 (now U.S. Pat. No. 9,378,949), Non-Final Rejection dated Feb. 24, 2015.

From U.S. Appl. No. 14/312,518 (now U.S. Pat. No. 9,378,949), Restriction Requirement dated Dec. 30, 2014.

From U.S. Appl. No. 15/148,991, (now U.S. Pat. No. 9,954,090), Restriction Requirement dated Mar. 15, 2017.

From U.S. Appl. No. 15/148,991, (now U.S. Pat. No. 9,954,090), Non Final Office Action dated May 25, 2017.

From U.S. Appl. No. 15/148,991, (now U.S. Pat. No. 9,954,090), Notice of Allowance dated Dec. 11, 2017.

\* cited by examiner

FIG. 2A
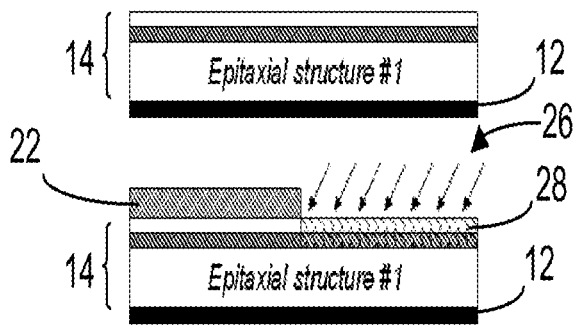
FIG. 2B
FIG. 2C
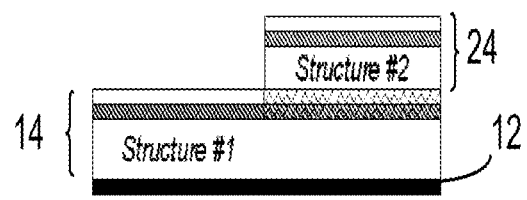

| GROWING A FIRST SET OF GROUP III NITRIDE EPITAXIAL LAYERS FOR A FIRST HFET ON A SUBSTRATE | 120 |

| DEPOSITING A MASK LAYER OVER THE FIRST SET OF GROUP III NITRIDE EPITAXIAL LAYERS | 122 |

| SELECTIVELY ETCHING THE MASK LAYER TO REMOVE THE MASK LAYER IN A REGION | 124 |

| GROWING A SECOND SET OF GROUP III NITRIDE EPITAXIAL LAYERS FOR A SECOND HFET IN THE REGION ON THE FIRST SET OF GROUP III NITRIDE EPITAXIAL LAYERS | 126 |

| IMPLANTING IONS IN THE REGION OF THE FIRST SET OF GROUP III NITRIDE EPITAXIAL LAYERS BEFORE GROWING A SECOND SET OF GROUP III NITRIDE EPITAXIAL LAYERS IN THE REGION | 128 |

FIG. 14

MONOLITHIC INTEGRATION OF GROUP III NITRIDE EPITAXIAL LAYERS

CROSS REFERENCE TO RELATED APPLICATIONS

This is a divisional application of U.S. patent application Ser. No. 15/148,991, filed on May 6, 2016, which is a divisional application of U.S. patent application Ser. No. 14/312,518, filed on Jun. 23, 2014, which is a divisional application of U.S. patent application Ser. No. 13/897,038, filed on May 17, 2013, which is a divisional application of U.S. patent application Ser. No. 13/105,706, filed on May 11, 2011, which are incorporated herein as though set forth in full.

STATEMENT REGARDING FEDERAL FUNDING

This invention was made under U.S. Government DARPA/CMO Contract No. HR0011-09-C-0126. The U.S. Government has certain rights in this invention.

TECHNICAL FIELD

This disclosure relates to Group III nitride based devices and in particular monolithic integration of multiple types of Group III nitride based devices.

BACKGROUND

In the prior art a method of monolithic integration has been practiced. Monolithic integration means integration within a single wafer or substrate. The prior art method involves forming a single epitaxial growth which has buried layers, then fabricating one device on the top of the wafer, and a second by selectively recessing to the buried epitaxial layers. For example, this technique has been used to demonstrate the integration of lasers and HBTs. There are several disadvantages of this technique. First, this method requires extremely precise recess etching in order to expose the buried epitaxial layers, and thus achieving high yield on high performance devices is difficult. Second, having a second layer of buried layers underneath the first can introduce undesirable performance limitations on devices fabricated on the top structure.

Another prior art method uses regrowth and has been used in As and P-based devices to fabricate photonic integrated circuits on a chip. For example, epi-layers suited for fabricating laser diodes may be grown, patterned and etched, and a different set of epi may be regrown in order to fabricate waveguides or optical modulators. In the GaAs material system, there are also reports of monolithic integration of laser diodes and MESFETs using the regrowth technique, as well as a report of integrated HEMTs and HBTs on a single wafer.

The prior art is described in the following publications: Choi et al., "Monolithic integration of silicon and gallium arsenisde devices", U.S. Pat. No. 4,774,205, September 1988; Mand et al., "Monolithic integration of optoelectronic and electronic devices", U.S. Pat. No. 4,847,665, July 1989; Zavracky et al., "Method of making monolithic integrated III-V type laser devices and silicon devices on silicon", U.S. Pat. No. 4,940,672, July 1990; Kinoshita et al., "Method for making a field effect transistor integrated with an opto-electronic device", U.S. Pat. No. 5,021,361, June 1991; Tegude et al, "Method of making monolithic integrated optoelectronic modules", U.S. Pat. No. 5,075,239, December 1991; Dentai et al., "Method for preparation of monolithically integrated devices", U.S. Pat. No. 5,432,123, July 1995; Cho et al., "Method for monolithic integration of multiple devices on an optoelectronic substrate", U.S. Pat. No. 6,503,768 B2, January 2003; Fish et al, "Method of making an opto-electronic laser with integrated modulator", U.S. Pat. No. 6,574,259 B1, June 2003; Bar-Chaim et al., "Monolithic optoelectronic integration of a GaAlAs laser, a field-effect transistor, and a photodiode", Appl. Phys. Lett., vol. 44, pp. 941-943, (1984); Egawa et al., "Monolithic Integration of AlGaAs/GaAs MQW Laser Diode and GaAs MESFET Grown on Si Using Selective Regrowth", IEEE Photonics Technology Letters, vol. 4, no. 6, June 1992; Lin et al., "Monolithic Integration of E/D-mode pHEMT and InGaP HBT Technology on 150-mm GaAs wafers", CS Mantech Conference, Austin Tex., May 14-17 (2007); and Streit et al., "Monolithic HEMT-HBT integration by selective MBE", IEEE Trans. Elect. Dev., vol. 42, no. 4, (1995), which are incorporated herein by reference.

Group III-nitride compound semiconductor devices, circuits, and systems are typically fabricated from a single epitaxial structure grown on a sapphire, SiC, Si, or GaN substrate. In the prior art, enhancement mode (E-mode) and depletion mode (D-mode) devices have been integrated on a single epitaxial structure through the use of either a selective gate recess etch or selective fluoride plasma treatment as described by M. Micovic, T. Tsen, M. Hu, P. Hashimoto, P. J. Willadsen, I. Milosavljevic, A. Schmitz, M. Antcliffe, D. Zhender, J. S. Moon, W. S. Wong, and D. Chow, "GaN enhancement/depletion-mode FET logic for mixed signal applications," Electronics Letters, vol. 41, no. 19, pp. 348-350, September 2005, and Y. Cai, Q. Cheng, W. C. W. Tang, K. J. Chen, and K. M. Lau, "Monolithic integration of enhancement- and depletion-mode AlGaN/GaN HEMTs for GaN digital integrated circuits," in IEDM Tech. Dig., December 2005, pp. 771-774, which are incorporated herein by reference. However, this prior art method has the disadvantage that all the devices are integrated on a single epitaxial structure, which results in less than optimal performance for different types of integrated devices.

Therefore, what is needed is a monolithic integration method for a Group III nitride material system that provides for monolithic integration of different devices on epitaxial structures optimized for the function of each device. The embodiments of the present disclosure answer these and other needs.

SUMMARY

In a first embodiment disclosed herein, a monolithically integrated device comprises a substrate, a first set of Group III nitride epitaxial layers grown on a first region of the substrate for a first heterostructure field effect transistor, and a second set of Group III nitride epitaxial layers grown on a second region of the substrate for a second heterostructure field effect transistor.

In another embodiment disclosed herein, a monolithically integrated device comprises a substrate, a first set of Group III nitride epitaxial layers grown on the substrate for a first heterostructure field effect transistor, and a second set of Group III nitride epitaxial layers grown on a region of the first set of Group III nitride epitaxial layers for a second heterostructure field effect transistor.

In yet another embodiment disclosed herein, a method of fabricating a monolithically integrated device comprises growing a first set of Group III nitride epitaxial layers for a first heterostructure field effect transistor on a substrate, depositing a mask layer over the first set of Group III nitride epitaxial layers, selectively etching the mask layer to remove the mask layer in a first region, etching the first set of Group III nitride epitaxial layers in the first region, and growing a second set of Group III nitride epitaxial layers for a second heterostructure field effect transistor in the first region.

In still another embodiment disclosed herein, a method of fabricating a monolithically integrated device comprises growing a first set of Group III nitride epitaxial layers for a first heterostructure field effect transistor on a substrate, depositing a mask layer over the first set of Group III nitride epitaxial layers, selectively etching the mask layer to remove the mask layer in a region, and growing a second set of Group III nitride epitaxial layers for a second heterostructure field effect transistor in the region on the first set of Group III nitride epitaxial layers.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 2A-2C show another process flow of fabricating monolithically-integrated III-nitride epi-layers on a single substrate which incorporates ion implantation rather than etching in accordance with the present disclosure;

FIG. 14 is a flow diagram of another method of fabricating a monolithically integrated device in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In one method described in the present disclosure a first stack of III-nitride epitaxial layers (epi-layers) is grown on a substrate. Then the epi-layers are patterned and selectively etched down to the substrate. Then, a second stack of III-nitride epi-layers is grown on the etched regions. This process can be repeated ad infinitum to achieve an arbitrary amount of III-nitride epi-layers on a single wafer. Semiconductor devices and integrated circuits can then be fabricated on the wafer in which the best type of epi-layer is used for each purpose, yielding monolithic circuits and systems with improved performance and complexity.

Figure 1A:
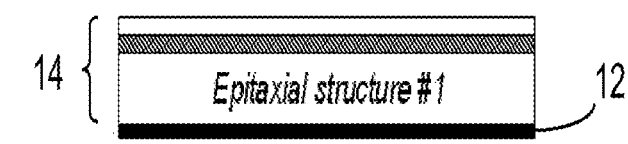
FIGS. 1A-1D show a process flow of fabricating monolithically-integrated III-nitride epi-layers on a single substrate in accordance with the present disclosure.
Figure 1C:
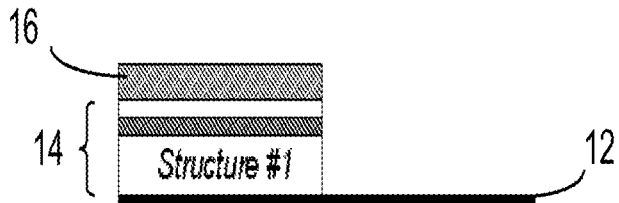
Figure 1D:
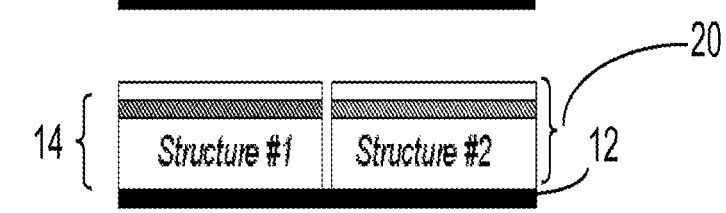
Figure 1B:
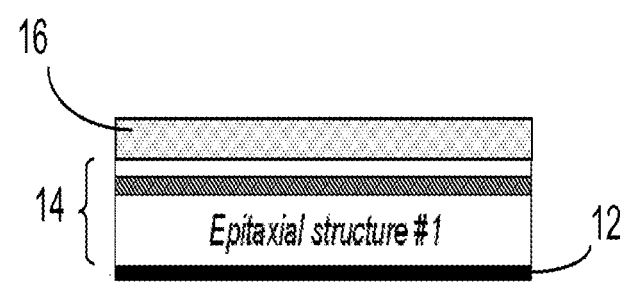

FIGS. 1A-1D show a process flow of fabricating monolithically-integrated III-nitride epi-layers on a single substrate in accordance with the present disclosure. As shown in FIG. 1A, an epitaxial structure for a first device, which may be an HFET, comprising Group III nitride (N) epitaxial layers 14, which may be AlN, GaN, or InN, is grown by a technique such as metal organic chemical vapor deposition (MOCVD), molecular beam epitaxy (MBE), or hydride vapor phase epitaxy (HVPE) on a substrate 12, which may be sapphire, SiC, Si, or GaN. Then a protective mask layer 16 is deposited over the epitaxial structure, as shown in FIG. 1B. The mask layer 16 may be photoresist, or may be metal or a dielectric such as $SiO_2$ or SiN. The mask layer 16 is then selectively patterned using a technique such as photolithography, electron-beam lithography, or imprinting. After patterning, the mask layer 16 is selectively etched using a wet (chemical) or dry (plasma-based) process such that a portion of the mask layer 16 is removed but the Group III-nitride epitaxial layers 14 under the removed portion of the mask layer 16 are unaffected. Next, the epitaxial layers 14 under the removed portion of the masked layer 16 are etched (by a wet or dry etch process) such that the exposed region of the epitaxial layers 14 are either fully or partially removed, as shown in FIG. 1C. Then, as shown in FIG. 1D on the regions where epitaxial layers 14 were fully or partially removed, a second set of epitaxial layers 20 which may be AlN, GaN, or InN, for a second device, which may be an HFET, are grown by a technique such as metal organic chemical vapor deposition (MOCVD), molecular beam epitaxy (MBE), or hydride vapor phase epitaxy (HVPE). Finally, the remaining mask layer 16 shown in FIG. 1C is removed, resulting in separate first and second epitaxial layers 14 and 20 on the single substrate 12, as shown in FIG. 1D.

FIG. 1D shows a preferred embodiment in accordance with the present disclosure in which the etch process completely removes the epitaxial layers 14, all the way down to the substrate 12. The etch process need not consist of a complete etch in this fashion. The etch may only go partially into the epitaxial layers 14, and growth of epitaxial layers 20 may begin from the remaining epitaxial layers rather than from the substrate 12. For example, an etch may only be through the active region of the device, and new epitaxial layer growth could start on a buffer layer under the active region of the device.

In another preferred embodiment, the epitaxial layers 14 are not etched. In this process, as shown in FIGS. 2A-2C, second epitaxial layers 24 are grown directly on top of the first epitaxial structure. As shown in FIG. 2A, an epitaxial structure comprising Group III nitride (N) epitaxial layers 14, which may be AlN, GaN, or InN, is grown by a technique such as metal organic chemical vapor deposition (MOCVD), molecular beam epitaxy (MBE), or hydride vapor phase epitaxy (HVPE) on a substrate 12, which may be sapphire, SiC, Si, or GaN. Then a protective mask layer 22 is deposited over the epitaxial structure, similar to depositing mask layer 16, as shown in FIG. 1B. The mask layer 22 may be photoresist, or may be metal or a dielectric such as $SiO_2$ or SiN. The mask layer 16 is then selectively patterned using a technique such as photolithography, electron-beam lithography, or imprinting. After patterning, the mask layer 22 is selectively etched using a wet (chemical) or dry (plasma-based) process such that a portion of the mask layer 22 is removed but the Group III-nitride epitaxial layers 14 under the removed portion of the mask layer 22 are unaffected. Then, as shown in FIG. 2C on the regions where the mask layer 22 is removed, a second set of epitaxial layers 24, which may be AlN, GaN, or InN, are grown by a technique such as metal organic chemical vapor deposition (MOCVD), molecular beam epitaxy (MBE), or hydride vapor phase epitaxy (HVPE). Finally, the remaining mask layer 22 shown in FIG. 2B is removed, resulting in first and second epitaxial layers 14 and 24, as shown in FIG. 2C.

In another embodiment, ion implantation 26 may be used to "destroy" the active region 28 of the first epitaxial layers 14 in the region exposed by the removed portion of mask layer 22, as shown in FIG. 2B. This may be done so that the first structure comprising the epitaxial layers 14 does not degrade the performance of the second structure comprising the epitaxial layers 24. The implanted ions may be aluminum ions.

There are many potential applications of devices fabricated with this process. Scaling of devices leads to improved small-signal gain and lower noise figure, which are desirable features for a low-noise amplifier (LNA), but degrades the breakdown voltage and thus the maximum output power, which are key features of a power amplifier. Using the fabrication methods of the present disclosure allows the fabrication of high performance transmit/receive (T/R) modules 30, as shown in FIG. 3, by incorporating two different HEMT structures: one for highly scaled devices suitable for an LNA 32 and transmit/receive switches 34, and another with less aggressive scaling, suitable for a power amplifier (PA) 36.

Figure 4:
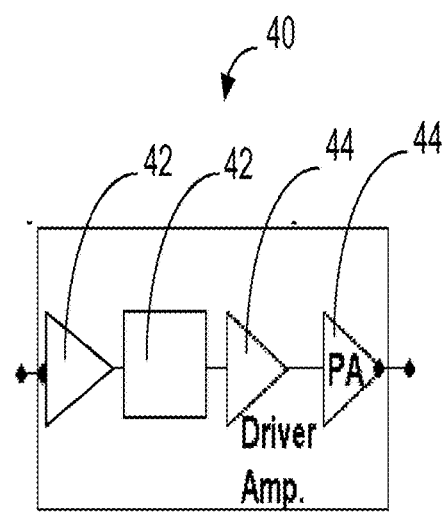
FIG. 4 shows a high-performance multiplier chain in which Schottky diodes are fabricated using one set of epitaxial layers and a power amplifier is fabricated using a second set of epitaxial layers in accordance with the present disclosure.

Similarly, this technique can also be used to produce a high-performance multiplier chain 40, as shown in FIG. 4, in which Schottky diodes 42 are fabricated using one set of epitaxial layers and the power amplifier 44 is fabricated using a second set of epitaxial layers.

Figure 3:
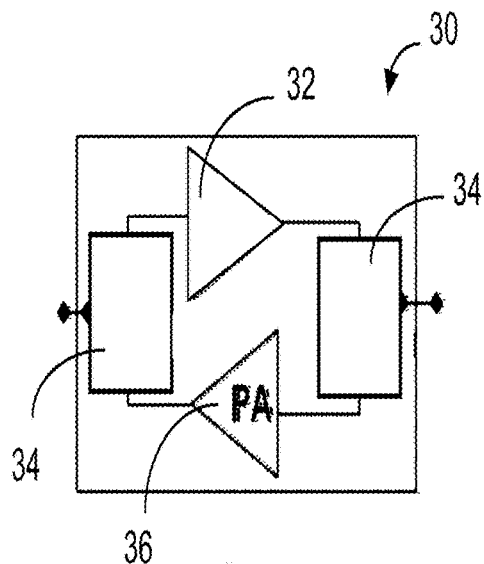
FIG. 3 shows a schematic of a high-performance RF transmit/receive (T/R) module MMIC in which the LNA and T/R modules are fabricated using a highly-scaled FET structure, and the power amplifier (PA) is fabricated using a structure suitable for higher drain bias in accordance with the present disclosure.
Figure 5:
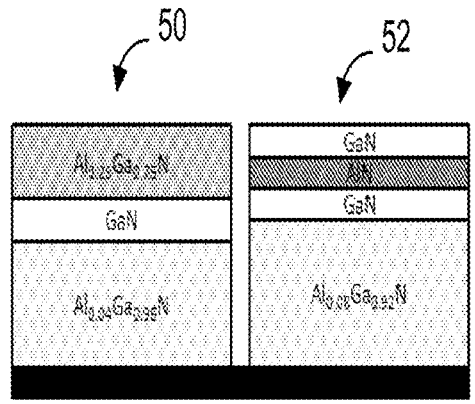
FIG. 5 shows an example of epitaxial structures which may be used for fabricating the circuit of FIG. 3 in accordance with the present disclosure.

FIG. 5 shows an example of epitaxial structures which may be used for fabricating the circuit of FIG. 3 in accordance with the present disclosure. The epitaxial structure 50 with the AlGaN barrier is more suited for a power amplifier (PA), and the epitaxial structure 52 with an AlN barrier is more suitable for an low noise amplifier (LNA).

In digital or mixed signal applications, it is desirable to have both enhancement and depletion mode devices on a single wafer such that low-power, high-density circuits can be designed using either direct-coupled FET logic (DCFL) or super buffer FET logic (SBFL) topology. The methods of the present disclosure are highly useful for achieving monolithic integration of enhancement and depletion mode structures for this purpose.

GaN-based heterostructure field effect transistors (HFETs) have demonstrated excellent performance in high-power and high-frequency applications. The unique combination of high electron velocity and high breakdown field has enabled devices with very high power density and power added efficiency (PAE) at microwave frequencies, as described by references [1, 2] listed below, which are incorporated herein by reference, in addition to millimeter-wave power amplifiers at frequency ranges as high as the W-band, as described by reference [3] listed below, which is incorporated herein by reference. Recently, there has also been interest in GaN HFETs for robust low-noise and mixed-signal applications, owing to the superior properties of this material system. There has been relatively little focus on digital applications of GaN HFETs largely due to the difficulty in obtaining a high-performance, normally-off device. In order to enable high-density, low-power logic circuits using either direct-coupled FET logic (DCFL) or super-buffer FET logic (SBFL) topology, both enhancement-mode (E-mode) and depletion-mode (D-mode) devices are needed on a single wafer. To date, there are only a few reports of monolithic integration of E- and D-mode devices, as described by references [4, 5] listed below, which are incorporated herein by reference.

Several approaches have previously been explored in order to achieve GaN HFETs with normally-off operation. Notably, recessed gates, as described by references [4, 6, and 7] listed below, which are incorporated herein by reference, and fluoride-based plasma surface treatment, as described by reference [8] listed below, which is incorporated herein by reference, have enabled high-performance devices. For highly scaled transistors, it is more desirable to achieve E-mode operation on as-grown material with a thin barrier layer without the use of any etching or plasma treatment. However, this approach typically yields very large parasitic resistance because surface depletion causes the 2DEG charge density to be very small in the access regions. A solution to this problem is to deposit SiN on top of the access regions, which was demonstrated to increase the charge density in the underlying 2DEG and dramatically improve device performance in E-mode devices, as described by references [9, 10] listed below, which are incorporated herein by reference.

Using the methods of the present disclosure, an E-mode device structure was formed which was highly scaled vertically, and then integrated with a D-mode device structure with a thicker AlN barrier layer on the same wafer. Previously, monolithic integration of E and D-mode devices was achieved on a single epitaxial structure through the use of either a selective gate recess etch or selective fluoride plasma treatment, as described by references [4, 5] listed below. The methods of the present disclosure allow an extra degree of freedom in that the epitaxial structures for the two devices may each be fully optimized for its function. A similar method has been used previously to integrate GaAs devices at the wafer level, as described by references [11, 12] listed below, which are incorporated herein by reference.

Using the methods of the present disclosure, E- and D-mode devices were fabricated on a single wafer, which demonstrates the feasibility of selective area regrowth to implement DCFL and SBFL circuits using GaN HFETs. The resulting devices had excellent DC and RF characteristics, and no degradation in device performance was observed as a result of either the regrowth or the additional process steps required to achieve monolithic integration. The application of this technique is not in any way limited to the integration of E- and D-mode devices, and this technique can greatly expand the design possibilities of RF and power switching circuits by integrating any two epitaxial structures, as described above.

Figure 6:
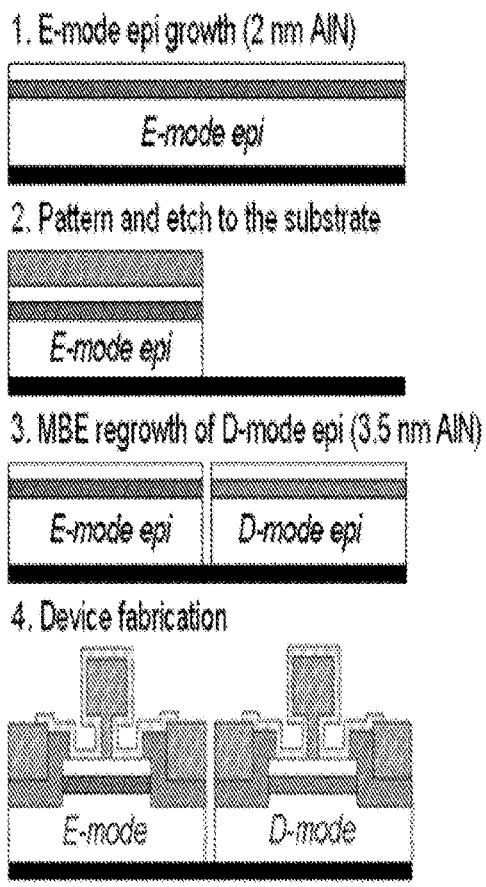
FIG. 6 shows a process outline of the selective molecular beam epitaxy (MBE) regrowth process for integration of E-mode and D-mode epi-layers in accordance with the present disclosure.
Figure 7:
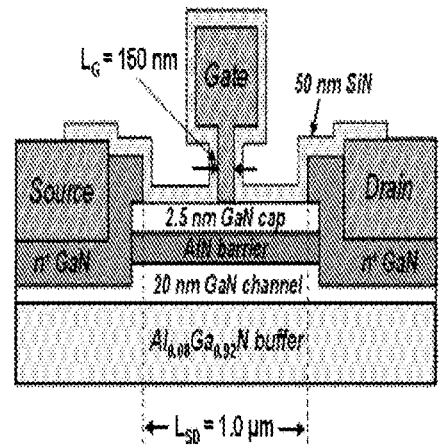
FIG. 7 shows a cross-section and dimensions of DHFETs E-mode devices and D-mode devices fabricated in accordance with the present disclosure.

The samples described herein were grown by plasma-assisted Molecular Beam Epitaxy (MBE) on SiC substrates. The structures were double-heterostructure FETs (DHFETs), and consisted of an $Al_{0.08}Ga_{0.92}N$ buffer, a 20 nm GaN channel, an AlN barrier, and a 2.5 nm GaN cap. The AlGaN buffer layer was added to reduce short-channel effects, as described by reference [13] listed below, which is incorporated herein by reference. The thickness of the AlN barrier was the primary parameter used to adjust the threshold voltage of finished devices, and was 2 nm thick for E-mode structures and 3.5 nm thick for D-mode structures. After the initial growth of an E-mode epitaxial structure, the wafer was patterned and the nitride layers were fully etched to the SiC substrate using a $Cl_2$-based dry plasma. A protective $SiO_2$ mask was deposited by plasma-enhanced chemical vapor deposition (PECVD) and patterned for use as a regrowth mask. The D-mode structure was then re-grown by MBE and the $SiO_2$ mask was removed. Once both epitaxial layers were grown, both E- and D-mode devices were processed simultaneously. Next, mesas were formed for device isolation and a new $SiO_2$ mask was deposited by PECVD. The ohmic regions of the wafer were then wet etched with an HF-based solution and the nitride layers were etched to a depth of approximately 25 nm using a $Cl_2$-based plasma. 50 nm of Si-doped n+ GaN was regrown on the ohmic regions by MBE, and the $SiO_2$ mask was removed. For the source and drain contacts, a Ti/Al/Pt metal stack was deposited on the n+ GaN and alloyed at 650° C. for 30 seconds. Pt/Au T-gates were fabricated using electron-beam lithography, and a 50 nm SiN passivation layer was deposited by PECVD. The final DHFETs had a gate length of 150 nm, a gate periphery of 2×37.5 m, and a source-drain spacing of 1 m. The process flow is shown schematically in FIG. 6, and the device cross-section and dimensions are shown in FIG. 7.

Figure 9:
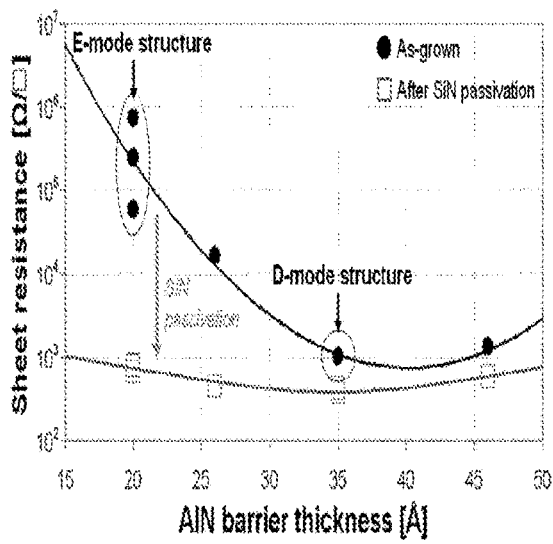
FIG. 9 shows the sheet resistance of the 2DEG as a function of the AlN barrier thickness for devices fabricated in accordance with the present disclosure.

As an initial experiment, the impact of the thickness of the AlN barrier layer on the 2DEG conductivity was investigated in order to optimize the epitaxial structure for both our E- and D-mode DHFETs. The channel sheet resistance, measured both before and after SiN passivation, is plotted vs. the barrier thickness in FIG. 9. Based on these data, a 2 nm barrier thickness was chosen for our E-mode device structure because the sheet resistance was ~$10^5$-$10^6$/square as-grown, meaning that devices were likely to show E-mode operation. Although the sheet resistance was high in the as-grown heterostructure, SiN passivation increased the 2DEG carrier concentration leading to a reduction in the sheet resistance to ~650–800/square which corresponds to a substantial reduction to access resistances in these DHFETs. This effect of SiN passivation has been observed previously and attributed to a reduction in the surface barrier height, as described by reference [9] listed below, which is incorporated herein by reference. The highest 2DEG conductivity was observed for a barrier thickness of 3.5 nm: the sheet resistance was 1030/square on the as-grown sample and 380/square after passivation. Therefore, this epi-structure was used for our D-mode devices.

Figure 8:
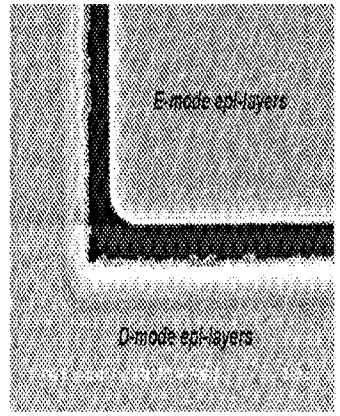
FIG. 8 shows a SEM image at 15K magnification of a transition between the E-mode and D-mode epi-layers fabricated in accordance with the present disclosure.

FIG. 8 shows a scanning-electron microscope (SEM) image of the E- and D-mode epi-layers following regrowth of the D-mode structure. There was no substantial difference observed in the quality of the material between the E-mode and D-mode epi-layers. A 0.5 m-wide trench between the E- and D-mode regions is present because different mask layers were used for etching the E-mode epi-layers and patterning the $SiO_2$ mask prior to regrowth of the D-mode epi-layers. The trench may be as narrow as 0.2 m-wide.

Figure 10:
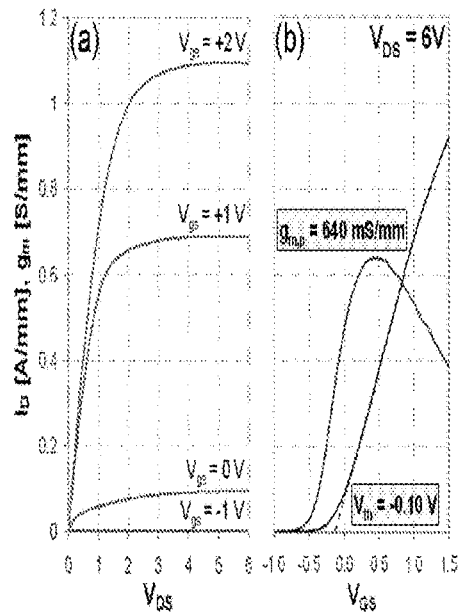
FIG. 10 shows a common-source IV and transfer characteristics ($V_D$=6V) of a D-mode DHFET fabricated in accordance with the present disclosure.
Figure 11:
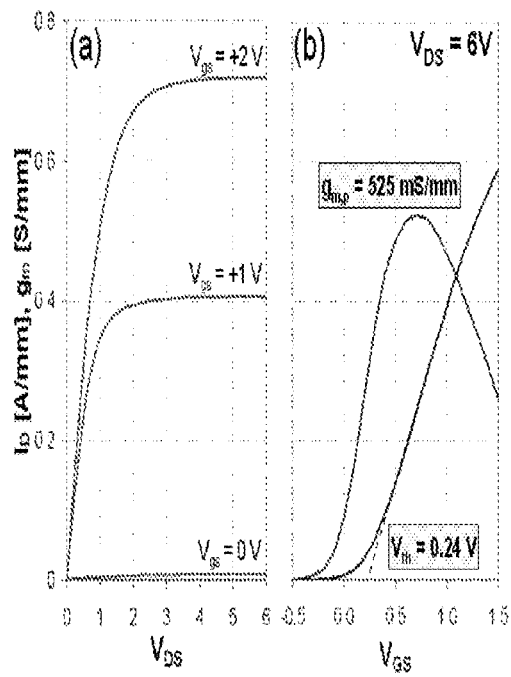
FIG. 11 shows a common-source IV and transfer characteristics of an E-mode DHFET fabricated in accordance with the present disclosure.

Common-source IV and transfer characteristics for a D-mode DHFET are shown in FIGS. 10(*a*) and 10(*b*) respectively. The device had a peak drain current ($I_{max}$) of 1.1 A/mm at a gate bias ($V_{gs}$) of 2 V. At a drain bias ($V_{ds}$) of 6 V, the peak transconductance ($g_m$) was 640 mS/mm and the extrapolated threshold voltage ($V_{th}$) was −0.10 V. The IV characteristics for a E-mode DHFET are shown in FIGS. 11(*a*) and 11(*b*). This device had an $I_{max}$ of 0.72 A/mm, peak $g_m$ of 525 mS/mm, and achieved normally-off operation with an extrapolated $V_{th}$ of 0.24 V.

Figure 12:
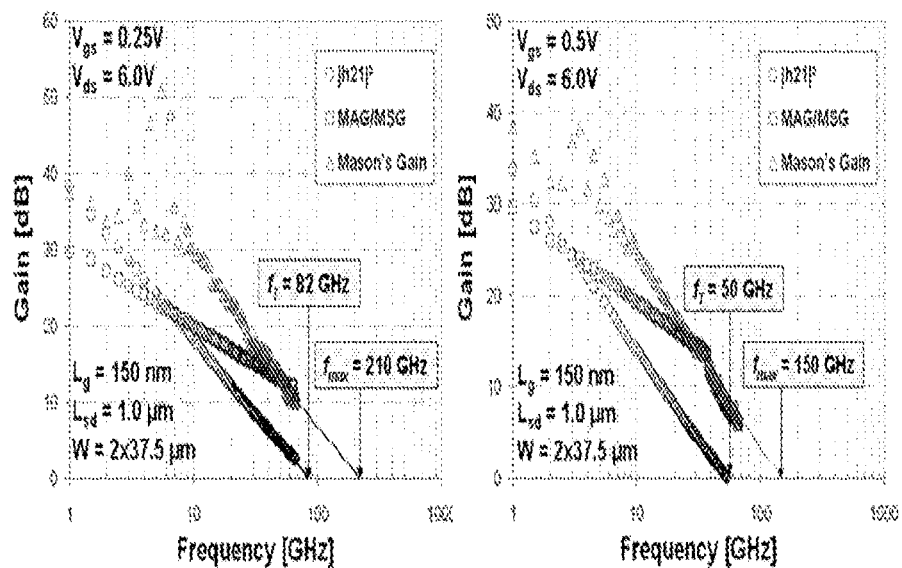
FIG. 12 shows small-signal RF characteristics of D-mode and E-mode DHFETs fabricated in accordance with the present disclosure.

Small-signal S-parameters were measured from 0.5 to 67 GHz using an Agilent E8361A network analyzer using a Short-Open-Load-Thru (SOLT) calibration. The effects of the parasitic pad capacitances and inductances were de-embedded using on-wafer open and short patterns. The current and power gain calculated from the S-parameters for each device is shown in FIGS. 12(*a*) and 12(*b*). The D-mode DHFET had a current-gain cutoff frequency ($f_T$) and power-gain cutoff frequency ($f_{max}$) of 82 GHz and 210 GHz respectively at a bias of $V_{gs}$=0.25V and $V_{ds}$=6.0V. The E-mode DHFET had an $f_T$ and $f_{max}$ of 50 GHz and 150 GHz respectively at a bias of $V_{gs}$=0.5V and $V_{ds}$=6.0V.

Monolithic integration of E-mode and D-mode AlN/GaN/AlGaN DHFETs was achieved through the use of selective area MBE regrowth. The resulting devices had excellent DC and small-signal performance, which demonstrates the feasibility of this technique to enable mixed-signal circuits based on GaN HFETs. Improved device performance is expected with aggressive lateral scaling of the gate length and source-drain spacing. This regrowth technique has many other potential applications in RF MMIC technology, and it provides additional flexibility when designing circuits and systems.

Figure 13:
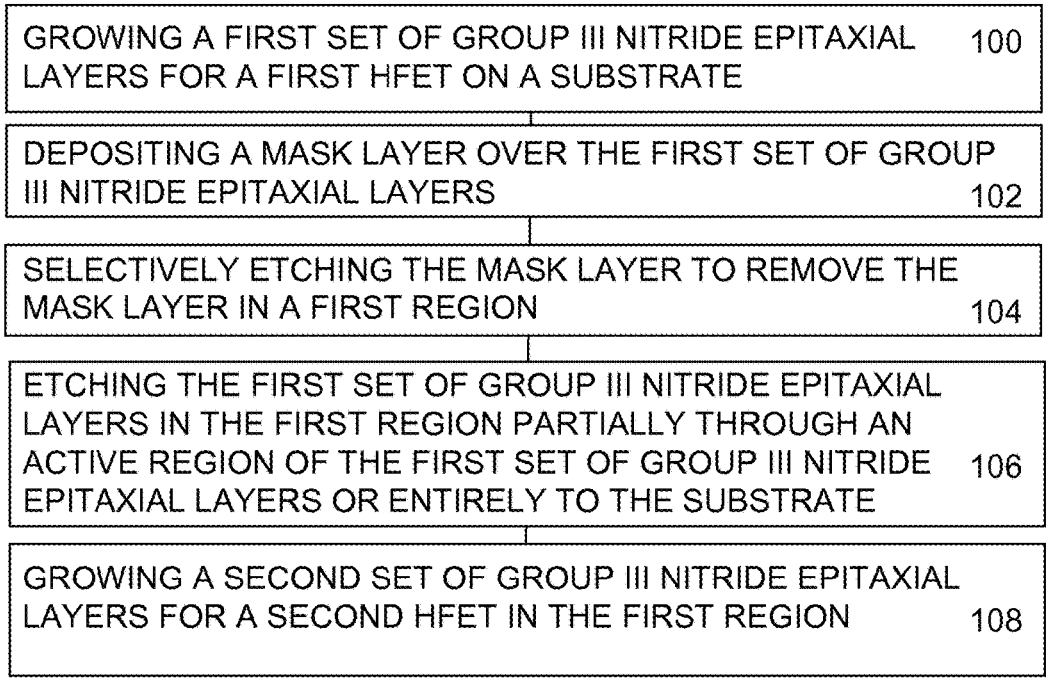
FIG. 13 is a flow diagram of a method of fabricating a monolithically integrated device in accordance with the present disclosure.

FIG. 13 is a flow diagram of a method of fabricating a monolithically integrated device in accordance with the present disclosure. In step 100 a first set of Group III nitride epitaxial layers are grown on a substrate for a first device. Then in step 102 a mask layer is deposited over the first set of Group III nitride epitaxial layers. Next in step 104 the mask layer is selectively etched to remove the mask layer in a first region. Then in step 106 the first set of Group III nitride epitaxial layers in the first region is etched partially through an active region of the first set of Group III nitride epitaxial layers or entirely to the substrate. Then in step 108 a second set of Group III nitride epitaxial layers for a second device is grown in the first region.

FIG. 14 is a flow diagram of another method of fabricating a monolithically integrated device in accordance with the present disclosure. In step 120 a first set of Group III nitride epitaxial layers for a first device are grown on a substrate. Then in step 122 a mask layer is deposited over the first set of Group III nitride epitaxial layers. Next in step 124 the mask layer is selectively etched to remove the mask layer in a region. Then in step 126 a second set of Group III nitride epitaxial layers for a second device are grown in the region on the first set of Group III nitride epitaxial layers. Optionally in step 128 ions may be implanted in the region of the first set of Group III nitride epitaxial layers before growing the second set of Group III nitride epitaxial layers in the region. The implanted ions may be aluminum ions.

REFERENCES

[1] Y.-F. Wu, A. Saxler, M. Moore, R. P. Smith, S. Sheppard, P. M. Chavarkar, T. Wisleder, U. K. Mishra, and P. Parikh, "30 W/mm GaN HEMTs by field plate optimization," IEEE Electron Device Lett., vol. 25, no. 3, pp. 117-119, March 2004.

[2] Y. Pei, R. Chu, N. A. Fichtenbaum, Z. Chen, D. Brown, L. Shen, S. Keller, S. P. DenBaars, and U. K. Mishra, "Recessed Slant Gate AlGaN/GaN High Electron Mobility Transistors with 20.9 W/mm at 10 GHz," Jpn. J. Appl. Phys, vol. 46, no. 45, pp. L1087, November 2007.

[3] M. Micovic et al., "W-band GaN MMIC with 842 mW Output Power at 88 GHz," presented at the International Microwave Symposium, Anaheim, Calif., May 23-28, 2010.

[4] M. Micovic, T. Tsen, M. Hu, P. Hashimoto, P. J. Willadsen, I. Milosavljevic, A. Schmitz, M. Antcliffe, D. Zhender, J. S. Moon, W. S. Wong, and D. Chow, "GaN enhancement/depletion-mode FET logic for mixed signal applications," Electronics Letters, vol. 41, no. 19, pp. 348-350, September 2005.

[5] Y. Cai, Q. Cheng, W. C. W. Tang, K. J. Chen, and K. M. Lau, "Monolithic integration of enhancement- and depletion-mode AlGaN/GaN HEMTs for GaN digital integrated circuits," in IEDM Tech. Dig., December 2005, pp. 771-774.

[6] T. Palacios et al., "High-performance E-mode AlGaN/GaN HEMTs," IEEE Electron Device Lett., vol. 27, no. 6, pp. 428-430, June 2006.

[7] R. Chu, Z. Chen, S. P. DenBaars, and U. K. Mishra, "V-gate GaN HEMTs with engineered buffer for normally off operation," IEEE Electron Device Letters, vol. 29, no. 11, pp. 1184-1186, November 2008.

[8] Y. Cai, Y. G. Zhou, K. J. Chen, and K. M. Lau, "High-performance enhancement-mode AlGaN/GaN HEMTs using fluoride-based plasma treatment," IEEE Electron Device Lett., vol. 26, no. 7, pp. 435-437, 2005.

[9] M. Higashiwaki, T. Mimura, and T. Matsui, "Enhancement-mode AlN/GaN HFETs using Cat-CVD SiN," IEEE Trans. Electron Devices, vol. 54, no. 6, pp. 1566-1570, June 2007.

[10] A. L. Corrion, K. Shinohara, D. Regan, I. Milosavljevic, P. Hashimoto, P. J. Willadsen, A. Schmitz, D. C. Wheeler, C. M. Butler, D. Brown, S. D. Burnham, and M. Micovic, "Enhancement-mode AlN/GaN/AlGaN DHFET with 700 mS/mm $g_m$ and 112 GHz $f_T$," Accepted by IEEE Electron Device Lett.

[11] T. Egawa, T. Jimbo, and M. Umeno, "Monolithic Integration of AlGaAs/GaAs MQW Laser Diode and GaAs MESFET Grown on Si Using Selective Regrowth," IEEE Photonics Technology Letters, vol. 4, no. 6, pp. 612-614, June 1992.

[12] D. C. Streit, D. K. Umemoto, K. W. Kobayashi, and A. K. Oki, "Monolithic HEMT-HBT Integration by Selective MBE," IEEE Trans. Electron Devices, vol. 42, no. 4, pp. 618-623, April 1995.

[13] M. Micovic et al., "GaN double heterojunction field effect transistor for microwave and millimeterwave power applications," in IEDM Tech. Dig., 2004, pp. 807-810.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of fabricating a monolithically integrated device comprising:
    growing a first set of Group III nitride epitaxial layers on a substrate for a first transistor;
    depositing a mask layer over the first set of Group III nitride epitaxial layers;
    selectively etching the mask layer to remove the mask layer in a region;
    implanting ions in the region of the first set of Group III nitride epitaxial layers; and
    growing a second set of Group III nitride epitaxial layers for a second transistor in the region on the first set of Group III nitride epitaxial layers;
    wherein implanting ions comprises implanting aluminum ions.

2. The method of claim 1 wherein:
    the first set of Group III nitride epitaxial layers comprise AlN, GaN, or InN or any combination of AlN, GaN, or InN; and
    the second set of Group III nitride epitaxial layers comprise AlN, GaN, or InN or any combination of AlN, GaN, or InN.

3. The method of claim 1 wherein the mask layer comprises a photoresist, a metal, or a dielectric.

4. The method of claim 3 wherein the dielectric is $SiO_2$ or SiN.

5. The method of claim 1 wherein selectively etching the mask layer comprises using a wet chemical or dry plasma-based process.

6. A method for providing a monolithically integrated device comprising:
- providing a substrate;
- providing a first set of Group III nitride epitaxial layers on the substrate for a first field effect transistor;
- implanting ions in a region of the first set of Group III nitride epitaxial layers; and
- providing a second set of Group III nitride epitaxial layers on the region of the first set of Group III nitride epitaxial layer for a second field effect transistor;
- wherein implanting ions comprises implanting aluminum ions.

7. The method of claim 6 wherein:
- the first set of Group III nitride epitaxial layers comprise AlN, GaN, or InN or any combination of AlN, GaN, or InN; and
- the second set of Group III nitride epitaxial layers comprise AlN, GaN, or InN or any combination of AlN, GaN, or InN.

8. The method of claim 6 wherein:
- the first field effect transistor comprises a low noise amplifier; and
- the second field effect transistor comprises a power amplifier.

9. The method of claim 6 wherein:
- the first field effect transistor is an enhancement mode device; and
- the second field effect transistor is a depletion mode device.

* * * * *